United States Patent

Chen et al.

[11] Patent Number: 6,118,390
[45] Date of Patent: Sep. 12, 2000

[54] APPARATUS FOR OBTAINING A PULSE WIDTH OF AN UNKNOWN PULSE SIGNAL

[75] Inventors: Poki Chen, Taipei; Shen-Iuan Liu, Keelung; Jing-Shown Wu; Hen-Wei Tsao, both of Taipei, all of Taiwan

[73] Assignee: National Science Council, Taipei, Taiwan

[21] Appl. No.: 08/948,648

[22] Filed: Oct. 10, 1997

[30] Foreign Application Priority Data

May 30, 1997 [TW] Taiwan .................................. 86107445

[51] Int. Cl.⁷ ........................... H03M 5/08; H03K 3/017; H03K 5/04; H03K 7/08
[52] U.S. Cl. ............................................. 341/53; 327/173
[58] Field of Search ..................... 327/172, 173, 327/26; 341/166, 118, 53; 326/17, 26; 324/607

[56] References Cited

U.S. PATENT DOCUMENTS

| 4,090,191 | 5/1978 | Kinbara | 341/118 |
| 5,168,181 | 12/1992 | Baiocchi et al. | 326/26 |
| 5,818,259 | 10/1998 | Martin | 326/17 X |
| 5,886,660 | 3/1999 | Loewenstein | 341/166 |

Primary Examiner—Brian Young
Assistant Examiner—Patrick Wamsley
Attorney, Agent, or Firm—Dougherty & Troxell

[57] ABSTRACT

An apparatus is provided for processing a pulse signal. The apparatus includes (1) a pulse-shrinking circuit for shrinking a specific quantity of a pulse width of the pulse signal; and (2) a feedback circuit electrically connected to the pulse-shrinking circuit for repetitively feeding the output pulse signal back to the input end of the pulse-shrinking circuit, the shrunk output pulse signal being further shrunk by the pulse-shrinking circuit in order to obtain a feedback number of the pulse signal before the pulse signal is vanished.

10 Claims, 8 Drawing Sheets

APPARATUS FOR OBTAINING A PULSE WIDTH OF AN UNKNOWN PULSE SIGNAL

FIELD OF THE INVENTION

The present invention relates to a signal processing apparatus, and especially relates to a time-to-digital converter for processing a pulse signal.

BACKGROUND OF THE INVENTION

Figure 1:
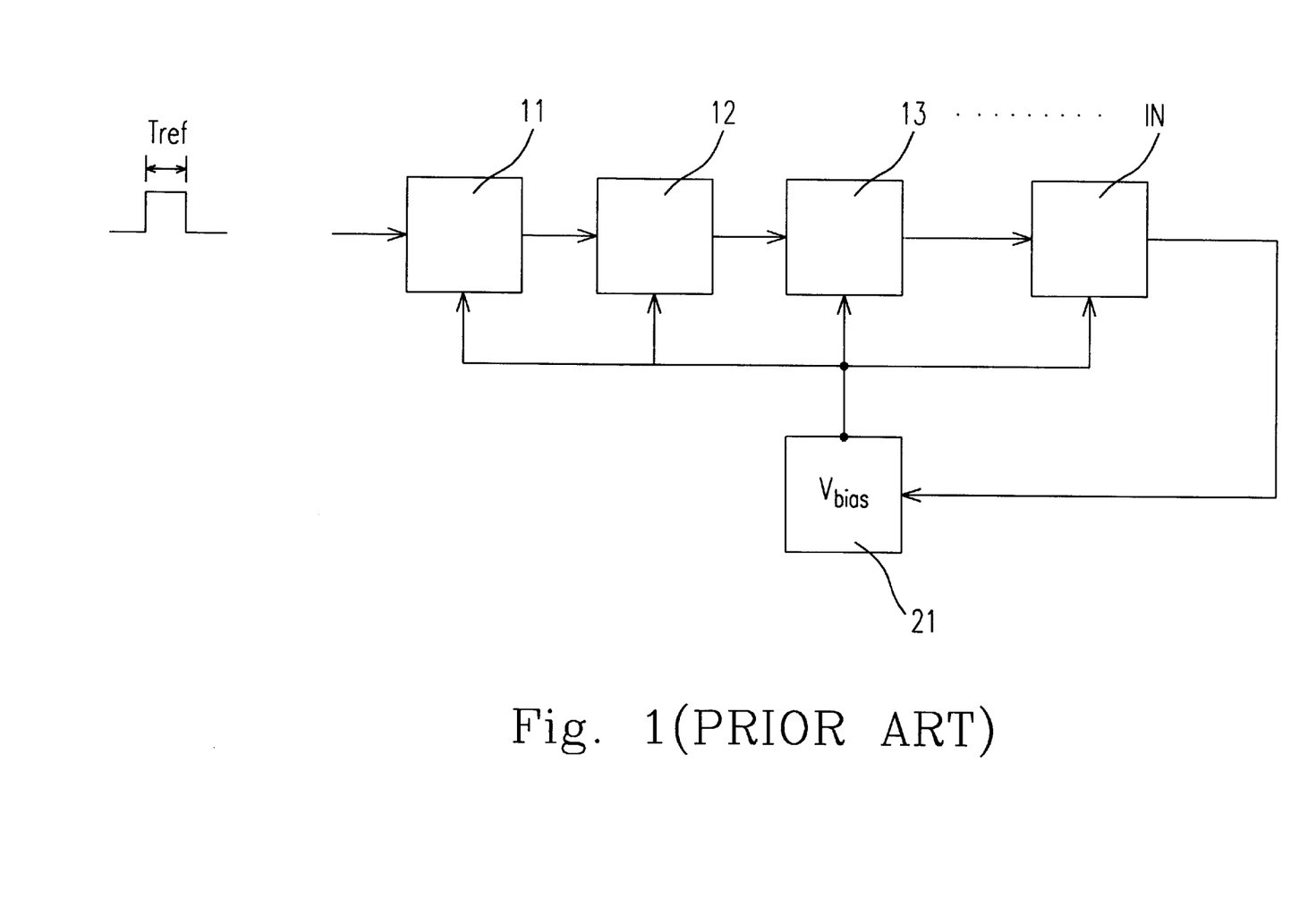
FIG. 1 is a schematic diagram showing the major circuit of the conventional CMOS TDC.
Figure 2:
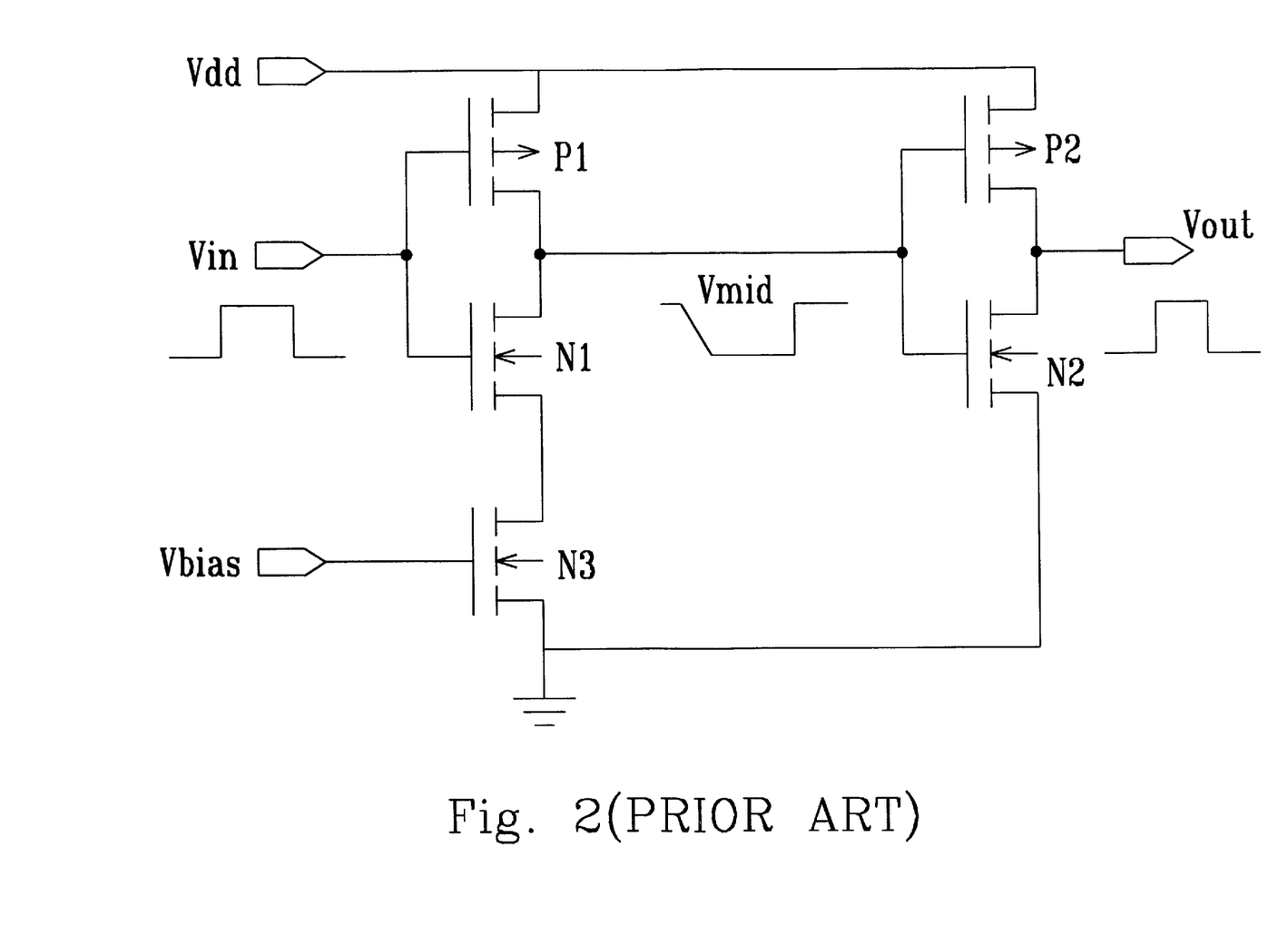
FIG. 2 shows a circuit of the conventional pulse-shrinking delay element.

When measuring a distance, if it is too long, or the distant object is something having relatively high surface temperature or something capable of vibrating or moving, the conventional measurement method would not be a good choice and must be replaced by other methods, such as a new range finder using laser or infrared rays. It must be noticed that a time-to-digital converter (TDC) is an important building block for this kind of new range finder. Before the circuit is integrated, emitter-coupled logic elements must be used in the circuit of TDC. If a circuit is as large as a Euro-1(10 cm×16 cm), occupying a lot of space in TDC and comsuming over than 5 W power, it is absolutely impossible to meet the requirement of a portable range finder. In order to avoid the shortages as described above, the circuit of TDC will be integrated by an electricity-economized process of complementary metal-oxide semiconductor (CMOS). Although the power consumption of TDC developed by new CMOS process can be greatly reduced to 15 mW, the measurement error of a single-shot is up to 3 nanoseconds (nS). Please refer to FIG. 1 showing the major circuit of the conventional CMOS TDC. Shown in FIG. 1 is a pulse-shrinking circuit consisting of a plurality of pulse-shrinking delay elements, 11 '12 ' . . . ' 1N, in a serial connection. FIG. 2 shows the detailed circuit of the pulse-shrinking delay element provided with a voltage of the power source Vdd. The operating principle is described as follows:

Every pulse-shrinking delay element includes two NOT gates. The maximum conducting current of the first NOT gate is controlled by a bias voltage Vbias of the transistor N3 because the conducting path of the first NOT gate, including two transistors P1 and N1, is serially connected with the transistor N3. The lower the bias voltage Vbias, the lower the conductivity of the transistor N3. However, the smaller the maximum conducting current of the first NOT gate, the weaker the ability for promoting the second NOT gate, including two transistors P2 and N2, to toggle its state. Therefore, the waveform of the pulse between two NOT gates has a gently descending edge so that the width of the valid pulse is shrunk and the width of the output pulse is also shrunk. It means that the degree for the width of the input pulse to be shrunk in passing every shrinking delay element can be easily controlled by adjusting the bias voltage Vbias.

During the period for processing a signal as shown in FIG. 1, the conventional TDC must be calibrated continuously. A stable reference pulse $T_{ref}$ having a known width is regularly sent to the input end of TDC and the delay-locked loop (DLL) 21 can properly adjust the bias voltage Vbias through its feedback loop so that the width of the input reference pulse can be gradually shrunk through a plurality of the pulse-shrinking delay elements 11 '12 ' . . . ' 1N and be finally vanished in the last one. Therefore, the shrinking range provided by every pulse-shrinking delay element is Tref/N. However, when the conventional TDC receives a request for measuring time, the above-described continuous calibration will be temporarily stopped, at the same time, an unknown pulse signal Tin is sent to the input end of TDC wherein the width of the unknown pulse signal Tin is the length of measure time. If the unknown pulse signal Tin is vanished in the nth pulse-shrinking delay element, the length of the measure time is n×Tref/N. Generally, the conventional TDC includes 64 pulse-shrinking delay elements in a serial connection and the width of the reference pulse for calibration is 50 nanoseconds, and hence the conventional TDC has a resolution of 50/64=0.78 nS, that is, the width of the least significant bit (LSB). Although the conventional TDC as described above can meet the requirement of a portable TDC with low power comsumption and high accuracy, there are some defects described as follows:

(1) The circuit must be continuously calibrated to ensure that the reference pulse is exactly vanished in the last pulse-shrinking delay element, and hence the logic gate of the pulse-shrinking delay element must be always in switching operation. This is the major cause of power consumption in the conventional TDC.

(2) Because the pulse-shrinking circuit has a plurality of the pulse-shrinking delay elements in a serial connection which will occupy a relatively long length or large area in the wafer, the mismatch among pulse-shrinking delay elements become so worse that more measurement errors may be generated.

(3) In the serially connected circuit of TDC, the number of the pulse-shrinking delay elements must be doubled for increasing an output bit, and the resultant too-long circuit structure needs to be folded into several segments. Unfortunately, the inter-segment wiring is relatively longer than that between pulse-shrinking delay elements, and hence the mismatch among pulse-shrinking delay elements gets worse. This is why the maximum number of output bits of the conventional TDC is limited to 6 or 7 bits.

(4) As shown in FIG. 2, if the width of the unknown pulse signal is so narrow that the voltage $V_{mid}$ between two NOT gates is unable to be switched to a level below the transtion voltage of the second NOT gate in time, there is no pulse output. The degree of pulse-shrinking in the latter pulse-shrinking delay elements, especially in the last one, is much bigger than that of the front pulse-shrinking delay elements. This phenomenon will also contribute measurement errors.

SUMMARY OF THE INVENTION

An object of the present invention is to provide an apparatus for processing a pulse signal.

A preferable embodiment according to the present invention is an apparatus including: (1) a pulse-shrinking circuit for shrinking a specific quantity of the pulse width of the pulse signal; and (2) a feedback circuit electrically connected to the pulse-shrinking circuit for repetitively feeding the pulse signal back to an input end of the pulse-shrinking circuit, the shrunk pulse signal being further shrunk by the pulse-shrinking circuit in order to obtain a feedback number of the pulse signal before the pulse signal is vanished.

In accordance with one aspect of the present invention, the pulse-shrinking circuit includes a pulse-shrinking delay element for shrinking a specific quantity of the pulse width of the pulse signal to be sent out after delayed for a specific period of time.

In accordance with another aspect of the present invention, the pulse-shrinking delay element includes two NOT gates.

In accordance with another aspect of the present invention, the pulse-shrinking circuit further includes a plurality of pulse-shrinking delay elements in a serial connection.

In accordance with another aspect of the present invention, the feedback circuit includes: (a) a counter electrically connected to an output end of the pulse-shrinking circuit for counting the feedback number in response to the pulse signal outputted from the pulse-shrinking circuit; and (b) a control unit electrically connected to the pulse-shrinking circuit for coupling the pulse signal outputted from the pulse-shrinking circuit back to an input end of the pulse-shrinking circuit and for resetting an initial state of the pulse-shrinking circuit.

Another object of the present invention is to provide a time-to-digital converter adapted to be used for obtaining a pulse width of an unknown pulse signal according to a reference pulse signal.

The time-to-digital converter of the present invention includes: (1) a pulse-shrinking circuit for shrinking a specific quantity of a pulse width of a specific pulse signal; (2) a feedback circuit electrically connected to the pulse-shrinking circuit for repetitively feeding the pulse signal back to an input end of the pulse-shrinking circuit, the shrunk pulse signal being further shrunk by the pulse-shrinking circuit in order to obtain a feedback number of the pulse signal before the pulse signal is vanished; and (3) a counting apparatus electrically connected to the feedback circuit for counting the respective required feedback numbers of shrinking the reference pulse signal and the unknown pulse signal to be vanished respectively for calculating the pulse width of the unknown pulse signal according to the reference pulse signal.

In accordance with one aspect of the present invention, the pulse-shrinking circuit includes a pulse-shrinking delay element for shrinking a specific quantity of the pulse width of the pulse signal to be sent out after delayed for a specific period of time.

In accordance with another aspect of the present invention, the pulse-shrinking delay element includes two NOT gates.

In accordance with another aspect of the present invention, the pulse-shrinking circuit further includes a plurality of pulse-shrinking delay elements in a serial connection.

In accordance with another aspect of the present invention, the feedback circuit includes: (a) a counter electrically connected to an output end of the pulse-shrinking circuit for counting the feedback number in response to the pulse signal outputted from the pulse-shrinking circuit; and (b) a control unit electrically connected to the pulse-shrinking circuit for coupling the pulse signal outputted from the pulse-shrinking circuit back to an input end of the pulse-shrinking circuit and for resetting an initial state of the pulse-shrinking circuit.

In accordance with another aspect of the present invention, the pulse width of the unknown pulse signal is calculated by the counting apparatus through steps as follows: (a) obtaining a feedback number N of shrinking the reference pulse signal having a known pulse width $T_{ref}$ to be vanished; (b) obtaining a feedback number N' of shrinking another reference pulse signal having a half of the known pulse width ($T_{ref}/2$) to be vanished; (c) obtaining a feedback number n of shrinking the unknown pulse signal having the pulse width $T_{in}$ to be vanished; and (d) calculating the pulse width $T_{in}$ of the unknown pulse signal by a formula as follows:

$$T_{in} = \frac{T_{ref}(n + N - 2N')}{2(N - N')}$$

The present invention may best be understood through the following description with reference to the accompanying drawings, in which:

DETAILED DESCRIPTION OF THE PREFERRED EMBODIMENT

Figure 3:
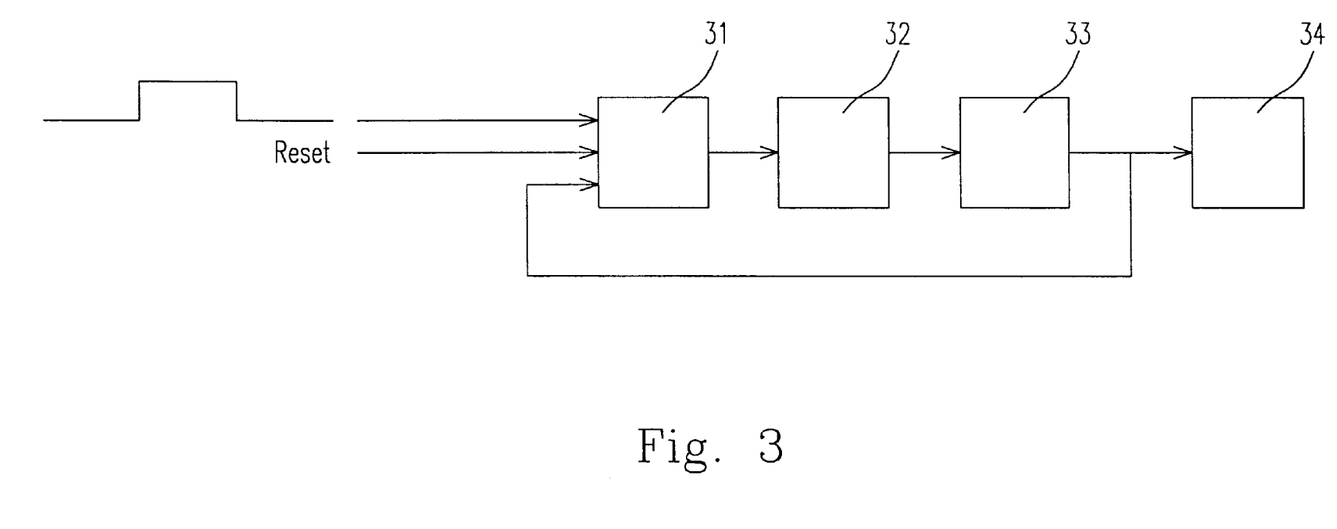
FIG. 3 is a block diagram showing a cyclic time-to-digital converter according to the present invention.

Please refer to FIG. 3 showing a cyclic time-to-digital converter (TDC) according to the present invention, in which the conventional linear structure of a TDC has been thoroughly replaced by a cyclic structure. A control unit 31 sends a pulse signal to a pulse-shrinking delay element 32. The width of the pulse signal is shrunk in a specific quantity for each time when it passes through the pulse-shrinking delay element 32 and is repetitively sent back to the control unit 31 after delayed for a specific period of time by a delay line 33 until the pulse signal is vanished. A counter 34 is electrically connected to an output end of the pulse-shrinking delay element for counting the feedback number in response to the pulse signal outputted from the pulse-shrinking delay element. If a reference pulse signal Tref is vanished after N cycles of being fed back to the pulse-shrinking delay element and an unknown pulse signal is vanished after n cycles, the measure time for the unknown pulse signal is n×Tref/N. This result is the same as that of the conventional linear TDC. The feedback number N of the reference pulse Tref can be up to hundreds or thousands if the bias voltage Vbias is properly controlled. Consequently, it becomes very easy to increase the resolution without needing more complicated hardware.

Figure 4:
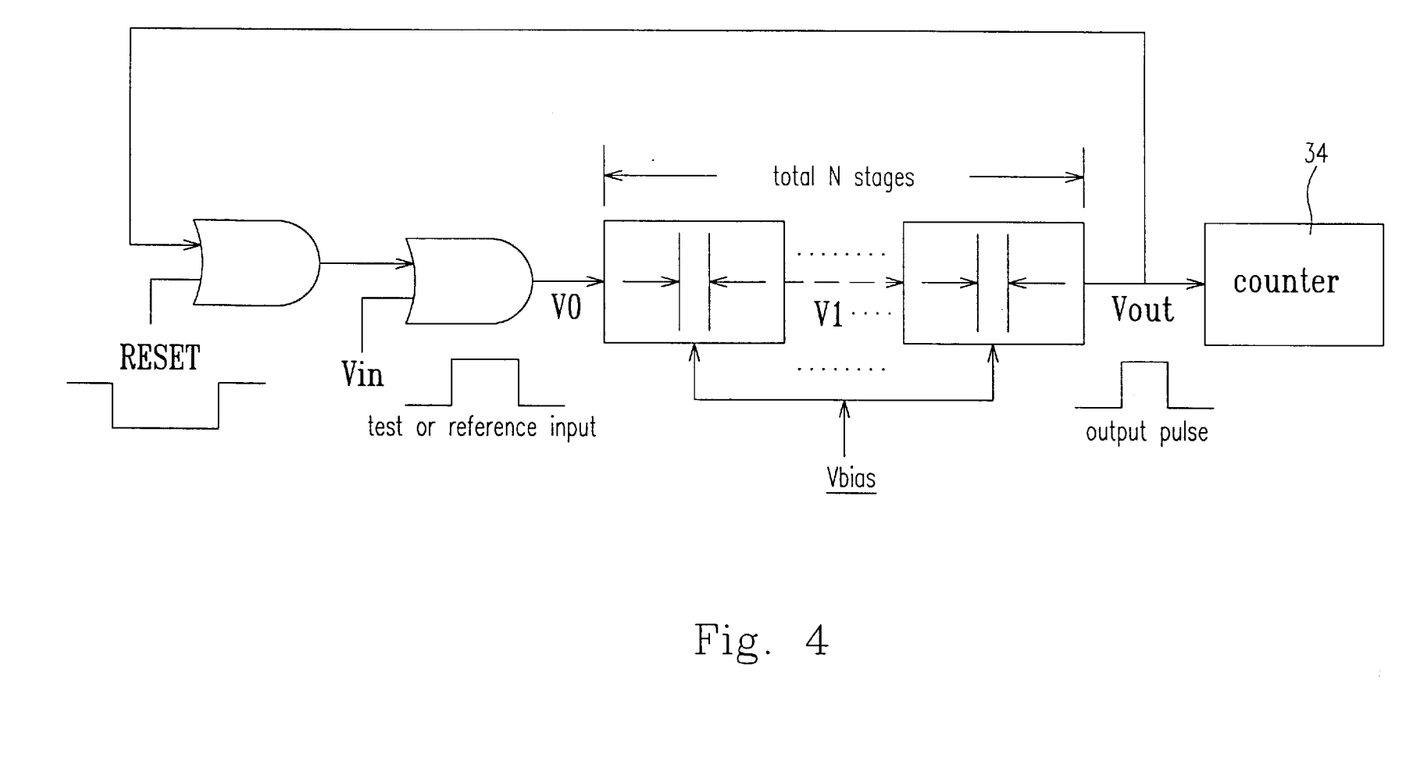
FIG. 4 is a block diagram showing the major circuit of the time-to-digital converter according to the present invention.

FIG. 4 shows the major circuit of the time-to-digital converter of a preferred embodiment of the present invention. In fact, the delay line 33 can be implemented as a plurality of pulse-shrinking delay elements in a serial connection. Every pulse-shrinking delay element includes an even number of equivalent NOT gates. Therefore, there are two stable states in this circuit, V0=V1= . . . =Vout=0 or V0=V1= . . . =Vout=1. If a RESET pin is added to the control unit, an exact stable state, V0=V1= . . . =Vout=0, will be established when RESET=0.

The features of the present invention are described in details as follows:

(1) For the conventional linear CMOS TDC, every pulse-shrinking delay element cannot efficiently match with each other no matter what kind of improved methods are used. The mismatch among pulse-shrinking delay elements is the major source of measurement errors. However, in the present invention, the input pulse must pass every pulse-shrinking delay element of the circulative structure for each cycle so that the width of the input pulse will be shrunk in the same quantity which is imperfectly not influenced by the mismatch among pulse-shrinking delay elements per cycle. Even though the too-long circuit structure needs to be folded into several segments, the width of the input pulse, shrunk in any one cycle, will not be influenced.

(2) In the present invention, the circuit does not need to be continuously calibrated to ensure that the reference pulse is exactly vanished in the last pulse-shrinking delay element. Therefore, the TDC circuit according to the present invention can be shut down during the spare period in measuring operations. Therefore, unneccessary power consumption can be avoided. Furthermore, the circuit according to the present invention does not need the delay-locked loop (DLL) and its related circuit for continuous calibration and hence a lot of the manufacturing cost can be saved.

(3) In the serially connected circuit of the conventional TDC, the number of the pulse-shrinking delay elements must be doubled for merely increasing one output bit. However, the number of output bit according to the present invention can be easily increased to exceed the limitation of the conventional TDC (6 or 7 bits), by just adding a bit in the counter and adjusting the bias voltage Vbias. High accuracy can thus be achieved without increasing cost.

(4) Due to the characteristic of the circuit, the width of the input pulse is rapidly decreased in the last several pulse-shrinking delay elements before the input pulse is vanished. This phenomenon exists in the conventional linear structure as well as the cyclic structure of the present invention. It cannot be improved in the conventional linear structure. However, it can be eliminated by treating it as an offset error in the cyclic structure of the present invention. The detailed process is described as follows:

First of all, the reference pulse signal $T_{ref}$ and another reference pulse signal having a half of the known pulse width ($T_{ref}/2$) are respectively sent to the cyclic structure of the present invention. If the feedback numbers N and N' are obtained respectively according to the measurement result of $T_{ref}$ and $T_{ref}/2$, the following equation can hence be taken into consideration:

$$T_{ref} = \alpha N + T_{offset}$$

$$T_{ref}/2 = \alpha N' + T_{offset} \quad (1)$$

where $\alpha$ is the effective resolution and $T_{offset}$ is the offset error generated in the last several pulse-shrinking delay elements. Thus, $$\alpha = \frac{T_{ref}}{2(N-N')} \quad (2)$$

$$T_{offset} = \frac{T_{ref}(N - 2N')}{2(N-N')}$$

If the effective resolution of $\alpha$ is not accurate enough, the bias voltage Vbias can be adjusted to obtain the required resolution. After finishing the calibration of this apparatus according to the present invention, it can be used to measure the unknown pulse signal. If the width of the unknown pulse signal Tin is shrunk until the unknown pulse signal is vanished to obtain the feekback number n, Tin can be calculated from a formula as follows:

$$T_{in} = \alpha \times N + T_{offset} = \frac{T_{ref}(n + N - 2N')}{2(N-N')} \quad (3)$$

Figure 5:
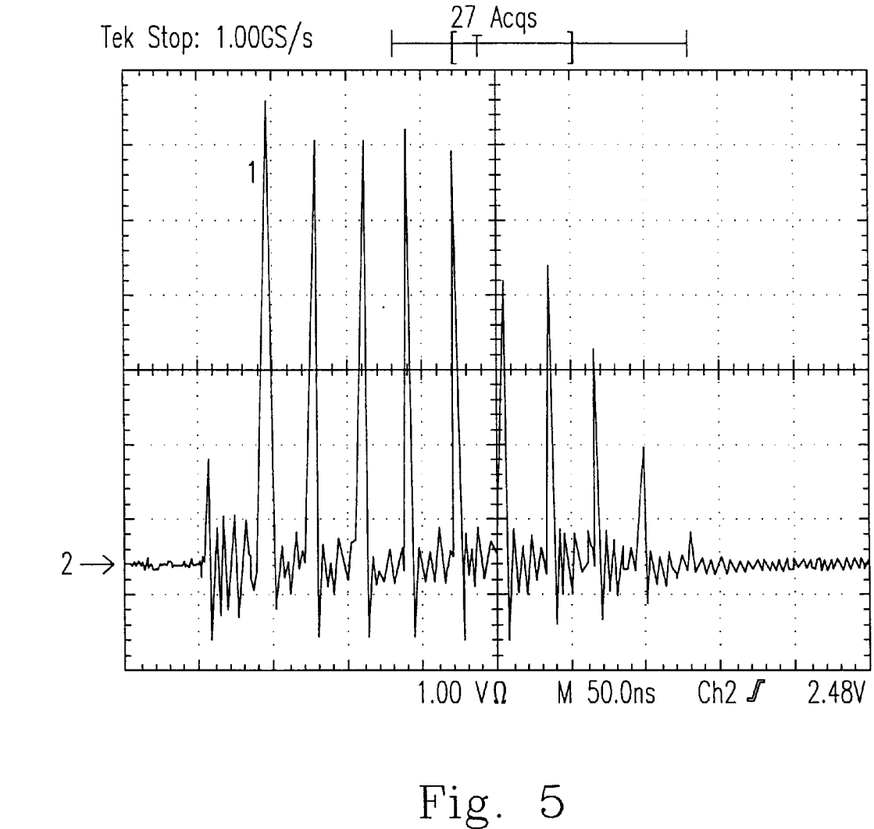
FIG. 5 is a diagram showing an output waveform of a preferred embodiment of the present invention when $T_{in}$ is 3.0 nanoseconds.
Figure 6:
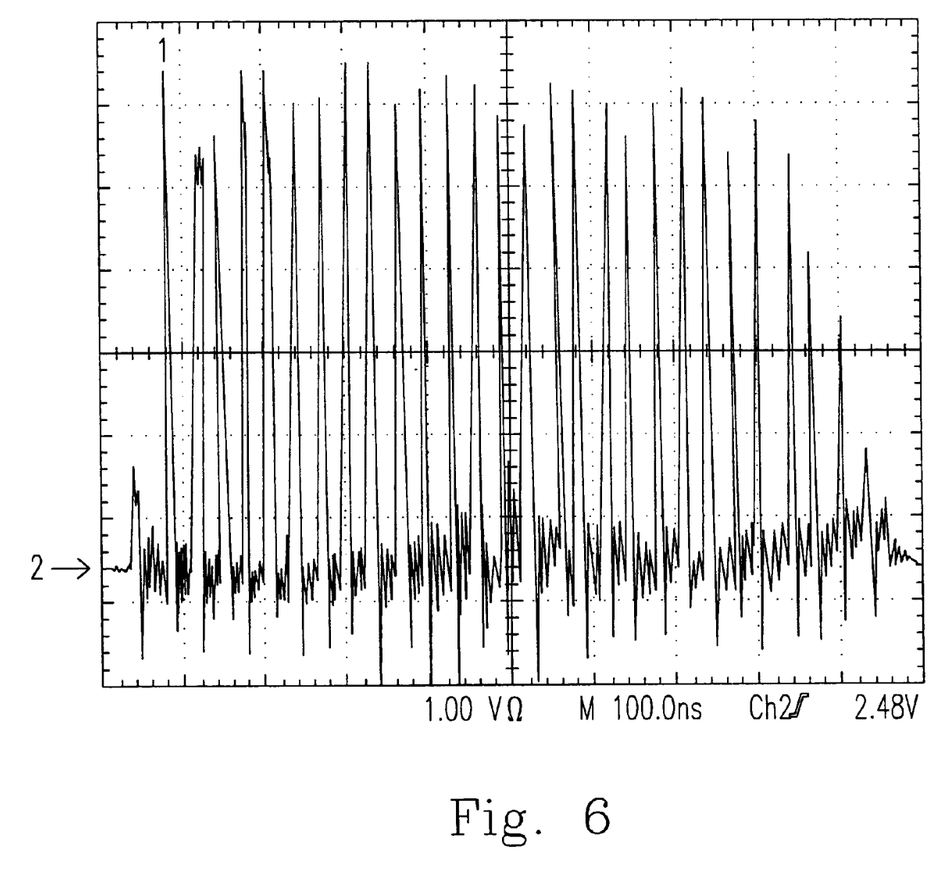
FIG. 6 is a diagram showing an output waveform of another preferred embodiment of the present invention when $T_{in}$ is 7.6 nanoseconds.

In order to verify that the width of the input pulse is shrunk in a fixed quantity in every cycle, two pulse signals, one is 3.0 nS and the other is 7.6 nS, are provided for comparison. Their waveforms outputted from the end of the delay line are recorded by a digital stored oscilloscope and the results are shown in FIG. 5 and FIG. 6 (the diagrams are completed by $10^9$ sampling times per second in the digital oscilloscope (e.g. Tek), wherein the vertical axis is 1 volt per unit and horizontal axis is 50 nS per unit). As shown in FIG. 5 and FIG. 6, it can be seen that the output waveforms are obviously and gradually reduced. Because the width of the pulse signal in FIG. 6 is bigger than that in FIG. 5, the feedback number of the former is greater than that of the latter. In addition, the pulse signals with the same width described as above (3.0 nS and 7.6 nS) are repeatedly measured for 50 times, the results are still the same as those of FIG. 5 and FIG. 6. Therefore, the measure results according to the present invention are very stable. It is unnecessary to average many-times results for increasing the accuracy like that for the conventional CMOS TDC.

Figure 7:
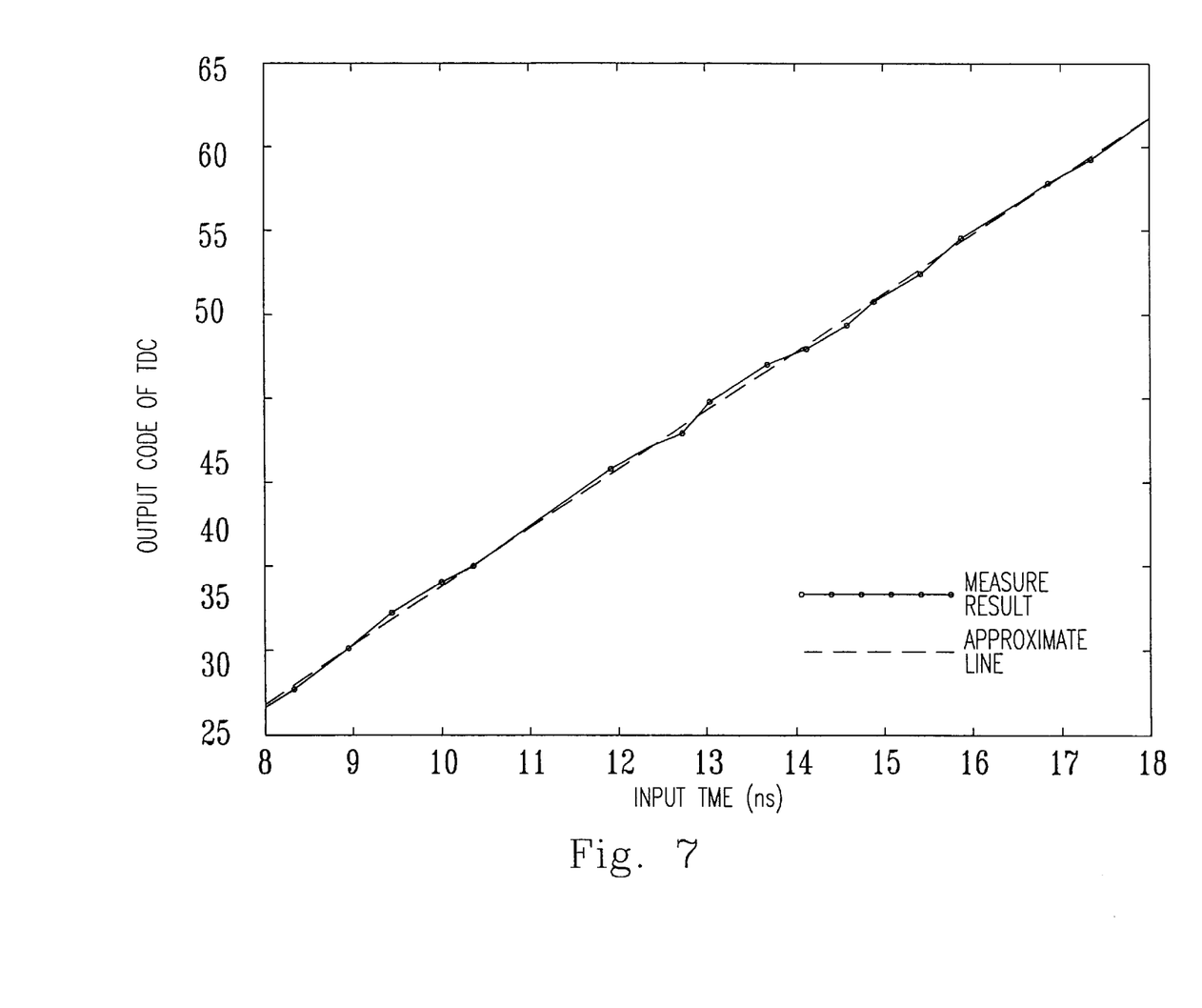
FIG. 7 is a schematic diagram showing the result of a single-shot measurement and the theoretical approximate value of a preferred embodiment according to the present invention.
Figure 8:
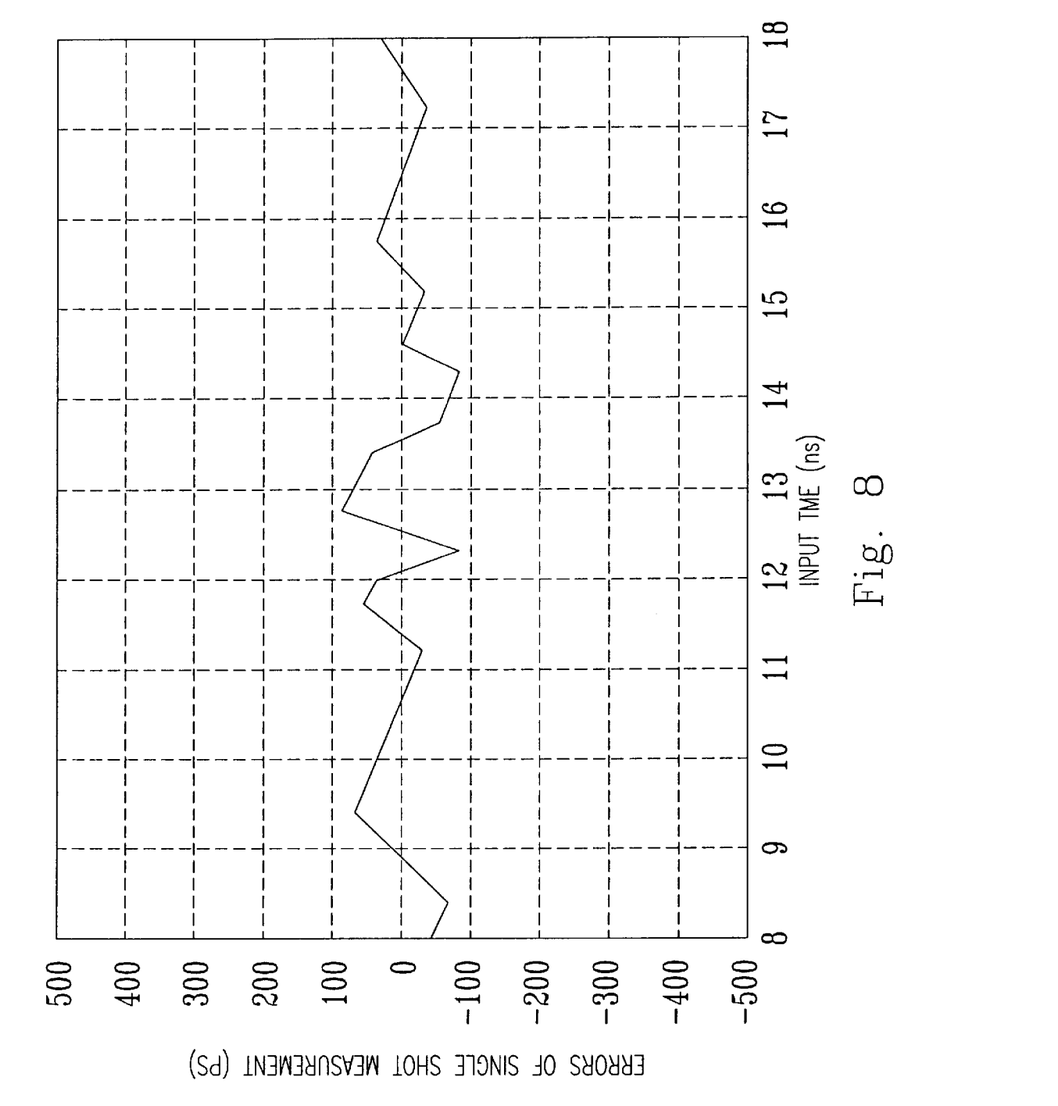
FIG. 8 is a schematic diagram showing the errors of a single-shot measurement of a preferred embodiment according to the present invention.

Furthermore, in order to verify whether the feedback number of the input pulse signal has a linear relationship with the width of the input pulse signal as shown by formula (3), we make a series of experiments under the same condition except changing time by time the width of the pulse signal which is generated by the pulse generater (e.g. HP8110A) and sent to TDC. The real width of the input pulse signal is accurately measured by a general counter (e.g. Standford Research Systems, SR620). All single-shot measurement results are shown in FIG. 7. The experiment value is very close to the theoretical value. The effective width of LSB is 0.286 nS which is calculated from the linear approximate line matched with the formula (3) and exceeds the record 0.78 nS of the conventional CMOS TDC. FIG. 8 is an amplification diagram showing the errors between the experiment value and the theoretical value. All single-shot errors are measured to be less than ½ LSB width (0.143 nS). Virtually, although the single-shot deviation with the conventional linear CMOS TDC can be made lower than 0.12 nS through an averaging calculation of ten-thousands of measurements values, the error can only be reduced to ½ LSB width (about 0.39 nS) which is still greater than that generated by the present invention. Moreover, the new TDC according to the present invention needs no continuous calibration, and hence the power comsumption is almost negligible because the internal logic gate is always in the inactive state except the very short measurement time period. As a result, the dissipation current is reduced from original 6 mA to lower than 100 nA that will greatly extend the lifetime of the electric batteries requisite for the related portable system.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An apparatus for obtaining a pulse width of an unknown pulse signal according to a reference pulse signal comprising:

a pulse-shrinking circuit for shrinking a specific quantity of a pulse width of said pulse signal;

a feedback circuit electrically connected to said pulse-shrinking circuit for repetitively feeding said pulse signal back to an input end of said pulse-shrinking circuit, said shrunk pulse signal being further shrunk by said pulse-shrinking circuit in order to obtain a feedback number of said pulse signal before said pulse signal is vanished; and, a counting device electrically connected to said feedback circuit which counting device shrinks pulse width to two predetermined levels relative to said reference pulse signal before said reference pulse signal is vanished to determine two feedback numbers, and calculates said pulse width of said unknown pulse signal using the two feedback numbers.

2. An apparatus according to claim 1 wherein said pulse-shrinking circuit includes a pulse-shrinking delay element for shrinking said specific quantity of said pulse width of said pulse signal to be sent out after delayed for a specific period of time.

3. An apparatus according to claim 2 wherein said pulse-shrinking delay element includes two NOT gates.

4. An apparatus according to claim 2 wherein said pulse-shrinking circuit further includes a plurality of pulse-shrinking delay elements in a serial connection.

5. An apparatus according to claim 1 wherein said feedback circuit comprises:

a counter electrically connected to an output end of said pulse-shrinking circuit for counting said feedback number in response to said pulse signal outputted from said pulse-shrinking circuit; and a control unit electrically connected to said pulse-shrinking circuit for coupling said pulse signal outputted from said pulse-shrinking circuit back to an input end of said pulse-shrinking circuit and for resetting an initial state of said pulse-shrinking circuit.

6. A time-to-digital adapted to be used for obtaining a pulse width of an unknown pulse signal according to a reference pulse signal comprising:

a pulse-shrinking circuit for shrinking a specific quantity of a pulse width of a specific pulse signal;

a feedback circuit electrically connected to said pulse-shrinking circuit for repetitively feeding back to said pulse-shrinking circuit, said shrunk pulse signal being further shrunk by said pulse-shrinking circuit in order to obtain a feedback number of said pulse signal before said pulse signal is vanished; and a counting apparatus electrically connected to said feedback circuit and counting said respective required feedback numbers of shrinking said reference pulse signal and said unknown pulse signal of said unknown pulse signal according to said reference pulse signal wherein said counting apparatus determines: a feedback number N of shrinking said reference pulse signal having a known pulse width Tref to be vanished; a feedback number N' of shrinking another reference pulse signal having a half of said known pulse width (Tref/2) to be vanished; and a feed back number n of shrinking said unknown pulse signal having said pulse width Tin to be vanished; and calculates said pulse width Tin of said unknown pulse signal by a formula as follows:

$$T_{in} = \frac{T_{ref}(n + N - 2N')}{2(N - N')}$$

7. A time-to-digital converter according to claim 6 wherein said pulse-shrinking circuit includes a pulse-shrinking delay element for shrinking said specific quantity of said pulse width of said pulse signal to be sent out after delayed for a specific period of time.

8. A time-to-digital converter according to claim 7 wherein said pulse-shrinking delay element includes two NOT gates.

9. A time-to-digital converter according to claim 7 wherein said pulse-shrinking circuit further includes a plurality of pulse-shrinking delay elements in a serial connection.

10. A time-to-digital converter according to claim 6 wherein said feedback circuit comprises:

a counter electrically connected to an output end of said pulse-shrinking circuit for counting said feedback number in response to said pulse signal outputted from said pulse-shrinking circuit; and a control unit electrically connected to said pulse-shrinking circuit for coupling said pulse signal outputted from said pulse-shrinking circuit back to an input end of said pulse-shrinking circuit and for resetting an initial state of said pulse-shrinking circuit.

* * * * *